United States Patent
Gargir et al.

(10) Patent No.: US 8,526,056 B2
(45) Date of Patent: Sep. 3, 2013

(54) DEVICE AND METHOD FOR PRINTING WITH CURABLE INK

(75) Inventors: Eyal Gargir, Kefar Sava (IL); Ran Vilk, Qiryat Ono (IL); Anton Andrusier, Ariel (IL)

(73) Assignee: Hewlett-Packard Development Company, L.P., Houston, TX (US)

( * ) Notice: Subject to any disclaimer, the term of this patent is extended or adjusted under 35 U.S.C. 154(b) by 862 days.

(21) Appl. No.: 12/670,590

(22) PCT Filed: Jul. 25, 2007

(86) PCT No.: PCT/US2007/016719
§ 371 (c)(1),
(2), (4) Date: Jan. 25, 2010

(87) PCT Pub. No.: WO2009/014519
PCT Pub. Date: Jan. 29, 2009

(65) Prior Publication Data
US 2010/0225940 A1    Sep. 9, 2010

(51) Int. Cl.
*G06F 15/00* (2006.01)
*B41J 2/07* (2006.01)
*B41J 2/12* (2006.01)
*B41J 2/01* (2006.01)

(52) U.S. Cl.
USPC .................. 358/1.9; 347/74; 347/78; 347/79; 347/101

(58) Field of Classification Search
USPC ........................ 358/1.9; 347/74, 78, 79, 101
See application file for complete search history.

(56) References Cited

U.S. PATENT DOCUMENTS

| 6,092,890 A * | 7/2000 | Wen et al. ..................... 347/101 |
| 6,626,527 B1 * | 9/2003 | Pinard .............................. 347/74 |
| 2003/0184633 A1 | 10/2003 | Vanhooydonck |
| 2004/0189772 A1 | 9/2004 | Arai |

FOREIGN PATENT DOCUMENTS

| EP | 1780015 A | 5/2007 |
| GB | 2390332 A | 7/2004 |

OTHER PUBLICATIONS

PCT international search report and written opinion in parent PCT parent patent application, PCT/US2007/016719, Jul. 25, 2007.

* cited by examiner

*Primary Examiner* — Charlotte M Baker

(57) ABSTRACT

A method for printing with curable ink is presented. The method comprises the steps of: generating an image wise pattern of spaced apart ink droplet locations for representing the image; and separating the pattern into at least first and second different interleaved portions, each portion comprising a plurality of droplet locations and the droplet locations of each interleaved portion being spaced apart from each other and spaced apart from the droplet locations of the remaining interleaved portions. In a first printing pass, ink droplets are deposited on the substrate at the drop locations of the first interleaved portion. Then, in a final printing pass, ink droplets are deposited on the substrate at the droplet locations of the second interleaved portion. The deposited ink droplets are then cured by exposing the deposited ink droplets to curing radiation in a first partial curing step between first and final printing passes and in a final curing step.

12 Claims, 7 Drawing Sheets

DEVICE AND METHOD FOR PRINTING WITH CURABLE INK

FIELD OF THE INVENTION

The method relates to the field of printing with curable ink and more particularly to inkjet printing with UV curable inks.

BACKGROUND

Inkjet printing is a method of printing that is well known in the art. The basics principles of this technology are described, for example, by Jerome L. Johnson in "Principles of Nonimpact Printing", Palatino Press, 1992, Pages 302-336 (ISBN 0-9618005-2-6). Commercial products which use inkjet printing methodologies are widely available, including computer printers and large format graphics printers.

An ink-jet print head typically consists of an array or matrix of ink nozzles, wherein each nozzle is adapted to selectively eject ink droplets. A given nozzle of the print head ejects an ink droplet in a predefined print position on the media. Thus, by adapting the nozzle(s) to move relative to the media, and by ejecting ink droplets in a particular arrangement or pattern on the media, a desired pattern or image may be printed.

Recently, curing of ink by radiation and in particular ultraviolet (UV) radiation has become popular in the field of printing. In such cases, the printer is equipped with a source of curing radiation such as a UV lamp or UV Light Emitting Diodes (LEDs) and special radiation-curable ink is used. An image printed by such a printer may then be cured by exposure to the curing radiation. "Curing" in the context of the present disclosure means a process of converting a liquid such as a monomer and in particular ink to a solid, by exposure to radiation, which may be UV radiation.

To obtain adequate curing of the curable ink, it must be exposed to UV radiation of sufficient power. Otherwise, uneven ink curing may take place. For example, if the radiation does not penetrate through the whole ink layer, a lower portion of the ink layer will not be cured, thereby leaving reactive monomers in the printed area, and interfering with the adhesion of the ink to the media substrate.

UV radiation/light may be generated by expensive mercury-containing lamps, which consume large amounts of energy, most of which is converted into heat. Such lamps quickly deteriorate with the time, and therefore need to be replaced regularly.

Preferably, prints should be ready for use at the end of the printing process, meaning that the printed ink should be fully cured. As the printing speed increases, the power of the UV lamps required to ensure complete ink curing to must also increase. Unfortunately, the life time of high power lamps is shorter than lower power lamps. Furthermore, the cost of high power lamps is generally disproportionately higher than lower power lamps. Thus, the UV lamps have become a speed-limiting factor for inkjet printing processes that use curable ink.

Consequently, there remains a need to develop a printing method that will enable high-speed printing and curing with reduced UV radiation power requirements.

BRIEF DESCRIPTION OF THE DRAWINGS

For a better understanding of the invention, embodiments will now be described, purely by way of example, with reference to the accompanying drawings, in which.

Like reference characters refer to the like parts throughout the different views. The drawings are not necessarily to scale, emphasis instead being placed upon illustrating the principles of the invention.

DETAILED DESCRIPTION OF THE INVENTION

Figure 1A:
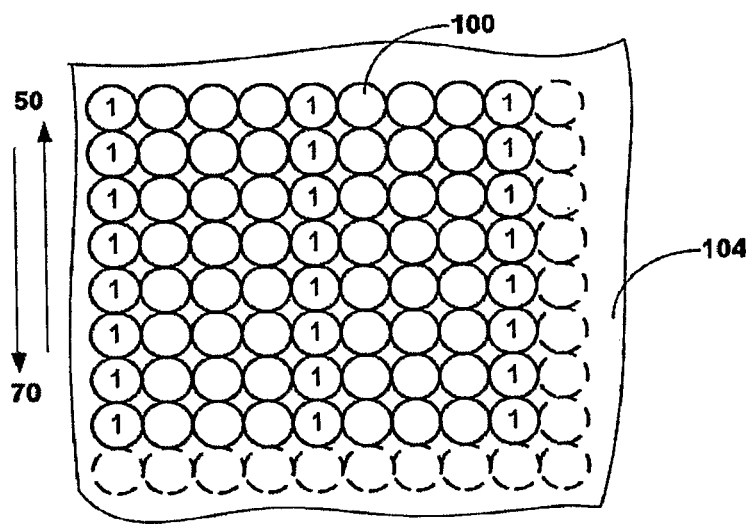
FIGS. 1A through 1C are schematic illustrations of prior art printing methods.
Figure 1B:
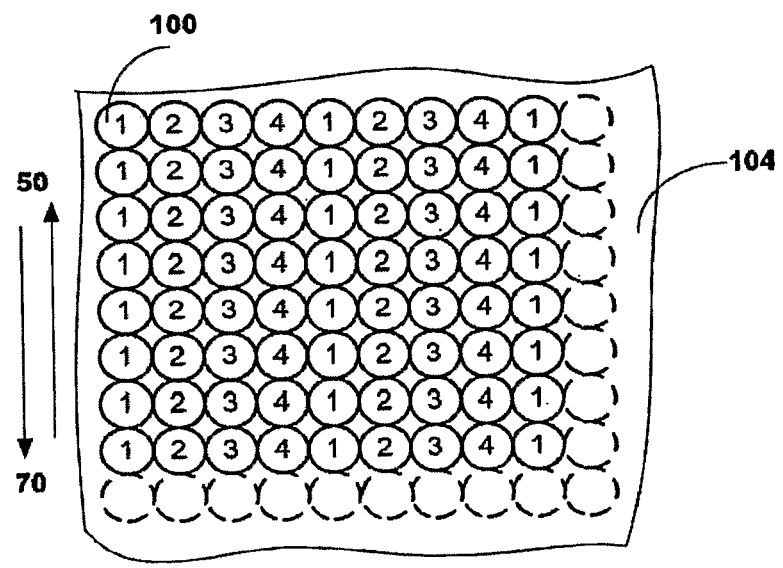
Figure 1C:
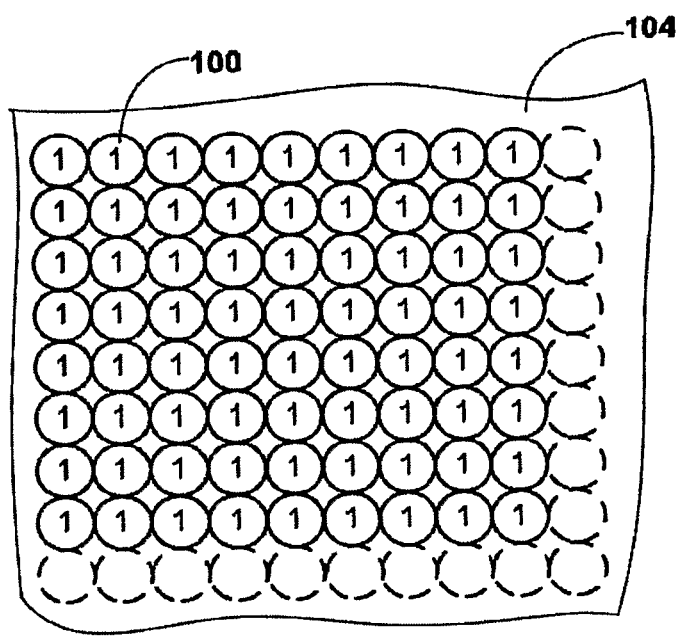

A common problem experienced when using inkjet printers in single or multi-pass mode for color or monochromatic printing relates to the location of printing dots 100 or ink droplets on a substrate 104 (see FIGS. 1A-1C). Typically, droplets are printed on top of each other or in close proximity to one another and because of this, they can bleed into each other, coalesce and deform in shape. This can significantly increase the thickness of the ink layer on the substrate 104. Thick ink layers require significantly larger amounts of radiation curing energy than thin ink layers, since the curing radiation has to penetrate the whole ink layer in order to cure the ink.

The printing resolution $R_p$ is usually higher than the native resolution of the print head, or the spacing $d_{ph}$ of the nozzles of a print head. In order to cover the whole image area by ink, the print head (or the media) should pass $n=(R_p/d_{ph})$ times (multi-pass for n>1) over the media (or below the print head). For example, if a desired print resolution $R_p$ is 400 pixels per inch (or dots per inch, dpi), a single print head with a nozzle pitch $d_{ph}$ of 100 nozzles per inch (or dots per inch, dpi) will need to scan in a reciprocating type of movement (the print swath) at least four times. Each scanning movement may be distant from the previous one by 1/400 of inch, although this can depend on the printing array resolution and the printing mode.

FIGS. 1A to 1B schematically illustrate a build-up of an image printed by a known printing method having a print resolution of 400 dpi and print head with native resolution of 100 dpi (therefore n=400/100=4). Each circle 100 represents an ink droplet and the number inside the circle represents the pass in which the droplet was printed. For simplicity of explanation, any overlap that may exist between adjacent ink droplets is not shown.

To increase the media throughput rate and/or the print quality, multiple print heads may be assembled into arrays. In such arrays, individual print heads are located to form arrays having a resolution equal to or higher than that of a single print head. FIG. 1C shows printing of an image by a print head array having a resolution equal to the printing resolution.

Figure 2A:
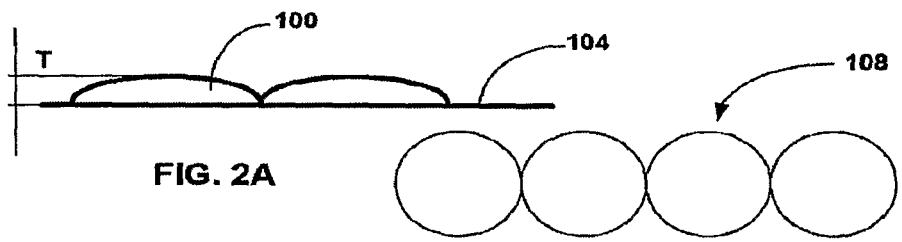
FIGS. 2A-2C are schematic illustrations of printed ink layer thickness as function of the ink droplet location.
Figure 2B:
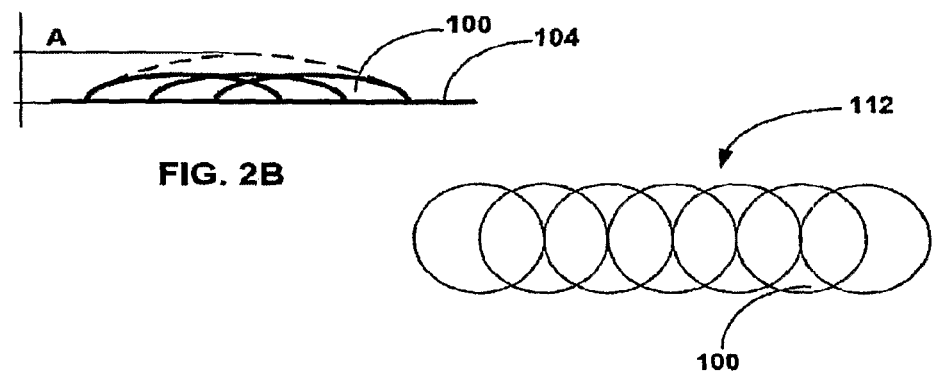
Figure 2C:
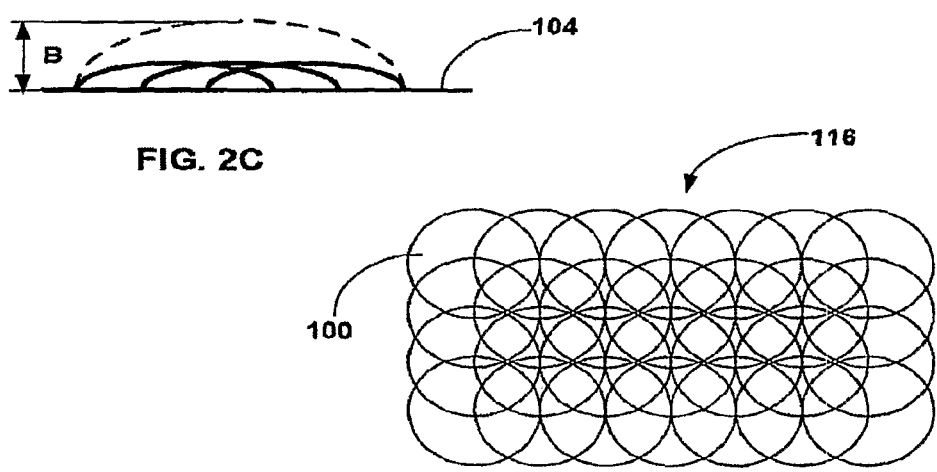

The energy required to cure a layer of deposited ink is proportional to the thickness of the ink layer. FIGS. 2A-2C illustrate the thickness of ink layers on media 104 generated by different adjacently located overlapping droplets 100. For comparison, the thickness T of an ink layer generated by a single droplet 100 (FIG. 2A) and a line 108 printed by single droplets 100 represents a basic or unity thickness. Printing a line 112 with overlapping droplets 100 (as shown in FIG. 2B) and printing an area 116 with overlapping droplets 100 (as shown in FIG. 2C) results in ink layers having a thickness A, B of at least two 2T and more than three 3T units, respectively. In the case each of printing an area 116 with overlapping droplets 100 (as shown in FIG. 2C), eight neighbor droplets 100 contribute some of the ink volume to a single droplet, thereby resulting in an ink layer of increased thickness.

The printing method according to the present invention, however, locates printing dots 100 on substrate 104 in a sparse arrangement. The term "sparse arrangement" means that a certain minimal distance L between each of the droplets exists and is maintained in each of the printing passes. In other words, the ink droplets deposited in a printing pass are spaced apart from each other.

By maintaining a distance between the ink droplets deposited in a printing pass, the probability of drop coalescence occurring is reduced and an increase in the ink layer thickness may be avoided. For example, when printing is performed with an equal print resolution $R_p$ in both directions, the distance between the ink droplets deposited in a printing pass should be at least twice that of the printing resolution, i.e. $2R_p$.

In this way, a method of inkjet printing by UV curable ink according to the invention comprises printing droplets of UV curable inkjet ink such that said droplets deposit an ink volume that may be cured by a minimal UV radiation power. An ink volume that may be cured by a minimal UV radiation power or an existing (required) UV source can be defined in terms of a number of droplets 100 contributing to such volume.

The droplets are ejected by one or more print heads and deposited on the media in a pattern, such that a distance between the neighboring drops is a maximal distance. Maximal distance means a distance wherein the droplets are located apart from each other (preferably, as far apart as possible) to at least prevent contact between neighboring ink droplets deposited on the substrate. Thus, the deposited ink droplets may form a single ink layer on the substrate.

A UV lamp is then operated to cure the deposited ink droplets. The UV to lamp operated to emit UV radiation, and the power of the curing (UV) radiation power may be determined by the volume of deposited ink droplets. Depending on the printer architecture (illustrated in FIGS. 6A and 6B), UV lamps 640 may travel together with the print head 630 (FIG. 6A) or be remain in a substantially stationary position (FIG. 68) over a substrate 104. Arrows 50 indicate the direction in which the print head moves during each pass and arrows 60 indicate a direction of substrate 104 displacement. FIG. 6B shows, in a simplified way, a drum type printer.

The volume of deposited ink is low, the ink layer thickness is minimal and the ink drop surface is maximal and open to penetration by incident curing radiation. Under such conditions, the required UV curing power is reduced, preferably to a minimum, and deposited ink is rapidly cured. Thus, during the next printing path, when the print head 630 (FIG. 6A) moves in the direction indicated by arrow 70 (i.e. in a reciprocating movement), ink droplets are once again deposited so that they are printed in a spaced apart arrangement. Any contact with cured ink droplets does not affect the curing of fresh ink droplets deposited in the more recent printing path.

Figure 3A:
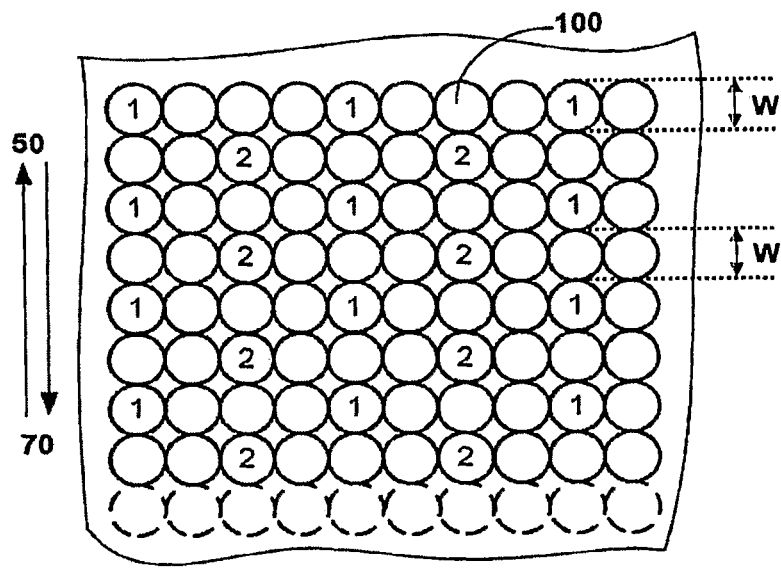
FIGS. 3A-3B are schematic illustrations of an exemplary embodiment of the present printing method.
Figure 3B:
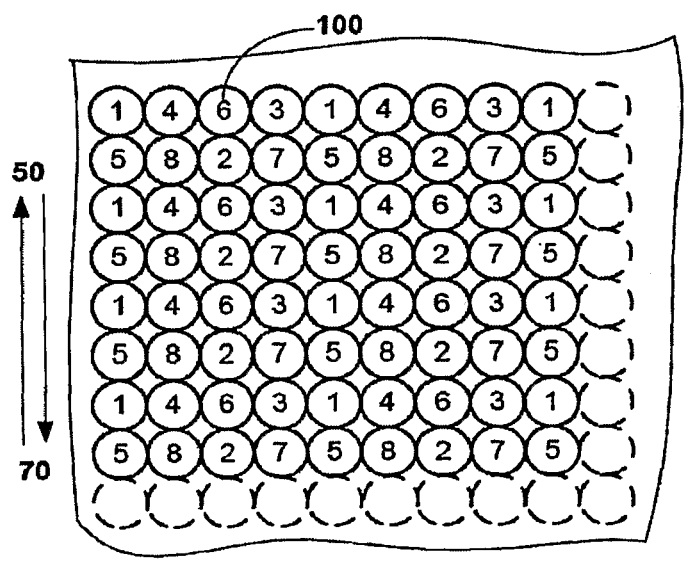

FIGS. 3A-3B schematically illustrate a build-up of the image of FIGS. 1A-1B printed according to one example, wherein the print resolution is 400 dpi and the print head has native resolution of 100 dpi. Of course, it should be understood that the invention is applicable to any relation between printing resolution and print head resolution and to any printer architecture.

As previously explained above, each circle 100 represents an ink droplet and the number inside the circle represents the pass in which the droplet was printed.

A pattern of spaced apart ink droplet locations is generated for representing the image. This pattern is then separated into at least first and second interleaved portions, the droplet locations of each interleaved portion being spaced apart from each other and spaced apart from the droplet locations of the remaining interleaved portions. In the example shown in FIGS. 3A-3B, the pattern is separated into eight interleaved portions.

Referring to FIG. 3A, a print head of the printer moves over the substrate during a first printing pass (as generally indicated by the arrow labeled "50"). During this first printing pass, the print head deposits ink droplets 1 on the substrate 104 at the drop locations of the first interleaved portion. Thus, as shown in FIG. 3A, the ink droplets 1 deposited in the first printing pass are spaced apart from each other.

During a next (second) printing pass, the print head reciprocates back over the substrate (as indicated by the arrow labeled "70") and deposits ink droplets 2 on the substrate 104 at the drop locations of the second interleaved portion. The ink droplets 2 deposited in the second printing pass are spaced apart from each other. Further, each ink droplet 2 deposited in the second printing pass is spaced apart from each ink droplet 1 deposited in the first printing pass.

From FIG. 3A, it will be understood that the ink droplets are deposited with a substantially uniform width W and that each ink droplet deposited in a printing pass is spaced apart from the remaining droplets deposited in the same pass by a distance at least equal to the width W of an ink droplet. Thus, the print head deposits ink droplets in a spaced apart arrangement so as to avoid the curing properties of later deposited ink droplets affecting or being affected by previously deposited ink droplets.

This process may then be repeated with further printing passes being completed, which deposit ink droplets in a spaced apart arrangement and spaced apart from earlier deposited ink droplets. Such printing passes may then be undertaken until no more ink droplets can be deposited without overlapping previously deposited ink droplets and/or a desired image is created from the arrangement of deposited ink droplets (as illustrated in FIG. 3B). In the example shown in FIGS. 3A-3B, eight printing pass are completed in order to deposit ink droplets at the locations defined by the eight interleaved portions, thereby resulting in a printed image that is represented by eight interleaved patterns of ink droplets.

The deposited ink droplets may be cured by being exposed to suitable curing radiation. Of course, it will be understood that such curing may take place immediately after deposition of the ink droplets so as to at least partially cure (surface curing) deposited ink droplets of a first printing pass before further ink droplets are deposited in a second printing pass.

Figure 4A:
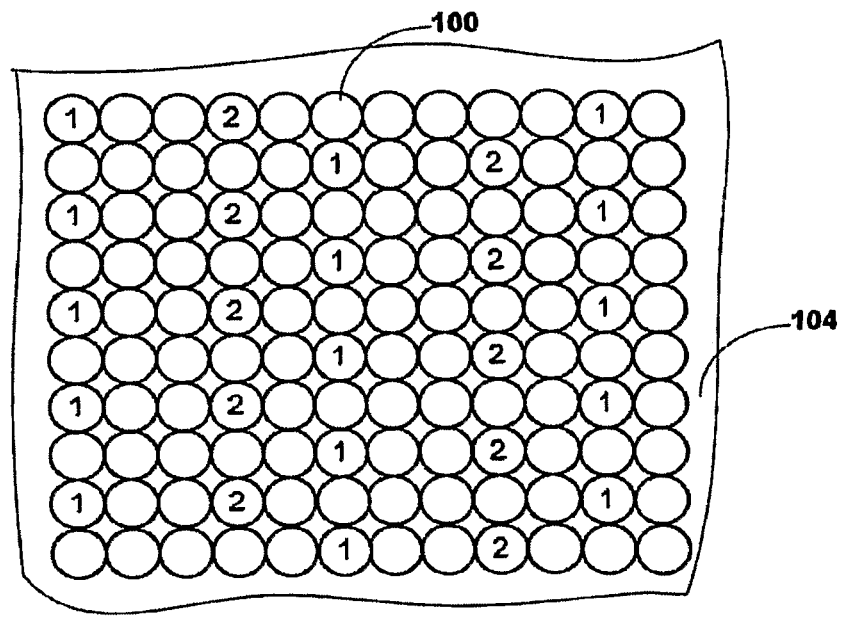
FIGS. 4A-4B are schematic illustrations of another exemplary embodiment of the present printing method.
Figure 4B:
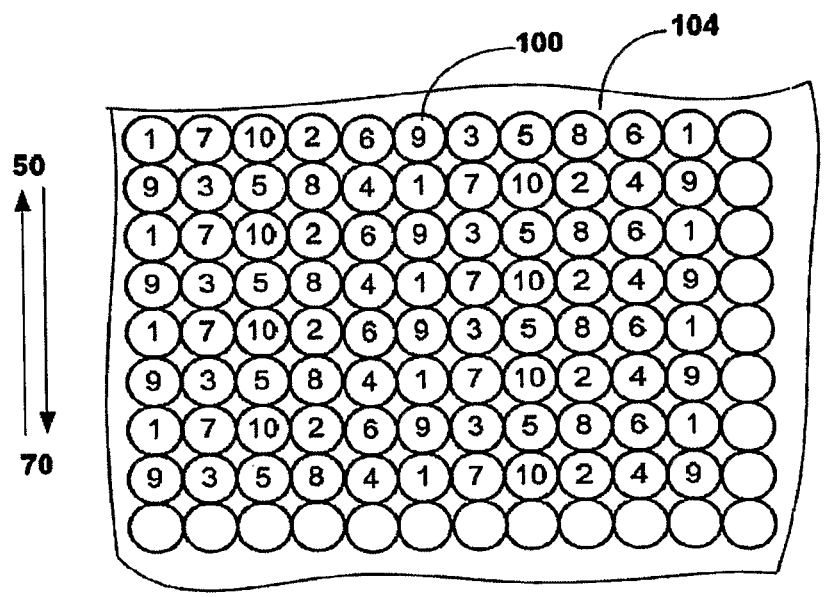

FIGS. 4A and 4B illustrate a build-up of an image printed according to one example, wherein the relation between the print head resolution and printing resolution is 1:5. The printer is a drum printer (FIG. 6B) where media 104 is mounted on a rotating drum 660 and a print head 630 moves in helical advance mode.

A pattern of spaced apart ink droplet locations for representing the image is generated. The generated pattern is then separated into ten interleaved portions, wherein the droplet locations of each interleaved portion are spaced apart from each other and spaced apart from the droplet locations of the remaining interleaved portions.

Referring to FIG. 4A, ink droplets 1 are deposited on the substrate 104 at the drop locations of the first interleaved portion in a first printing pass. Then, in a second printing pass, ink droplets 2 are deposited on the substrate 104 at the droplet locations of the second interleaved portion.

Referring now to FIG. 4B, third to tenth printing passes are completed, wherein, in each printing pass, ink droplets are deposited on the substrate 104 at the drop locations of the third to tenth interleaved portions, respectively.

After undertaking the ten printing passes, no more ink droplets can be deposited without overlapping previously deposited ink droplets and the desired image is created from the pattern of interleaved ink droplet portions.

Although the above explanation has been provided for single coloured or monochromatic printing, the invention is also applicable to color printing. In another embodiment, a sparse printing pattern is formed by printing a different amount of ink droplets in each printing pass. Some colors that can cure more easily, such as Light Cyan (C) or Light Magenta (M), may have a higher printed proportion at a single pass than colors that are more difficult to cure, such as black (K).

Figure 5A:
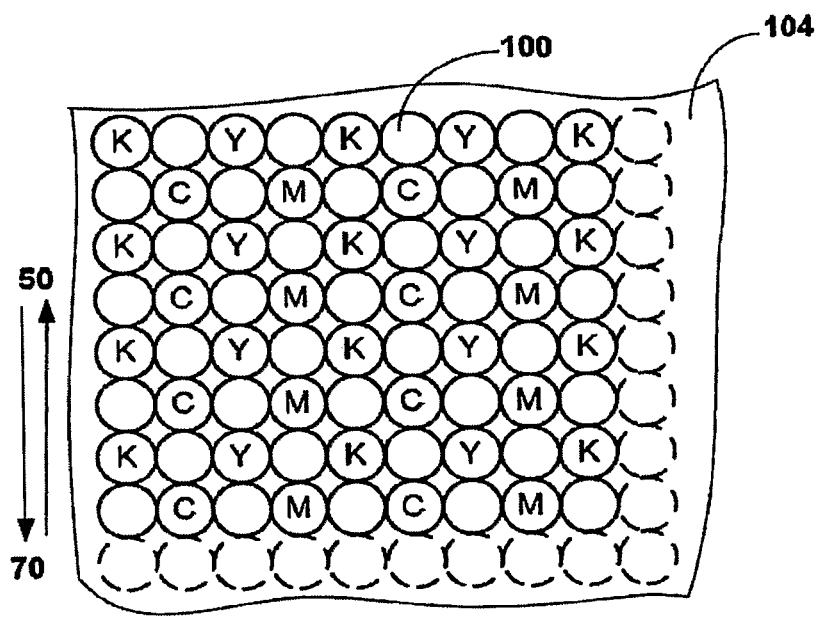
FIG. 5 is a schematic illustration of an exemplary embodiment of color printing by the present method.
Figure 5B:
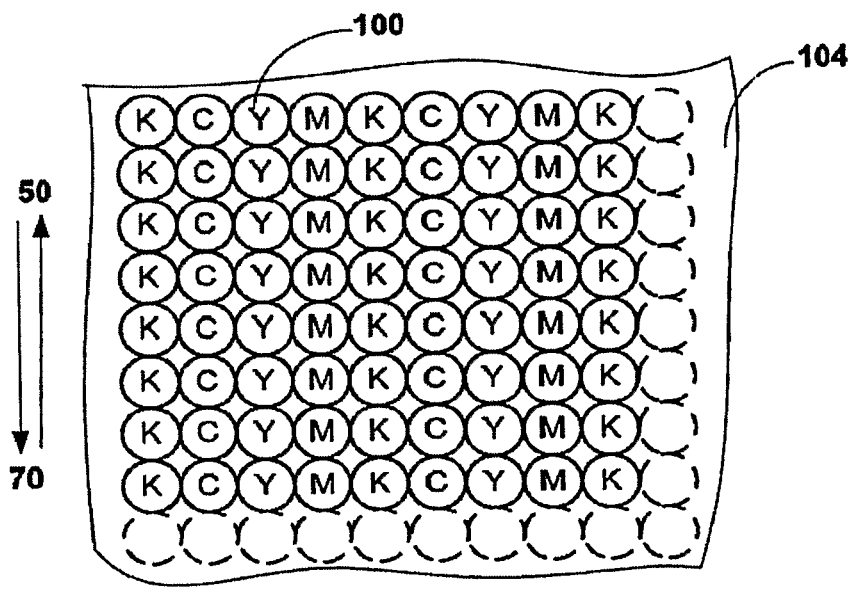

FIGS. 5A and 5B illustrate a build-up of a color image printed according to the invention, wherein a relation between the native print head resolution and printing resolution equal to 1:4.

Figure 6A:
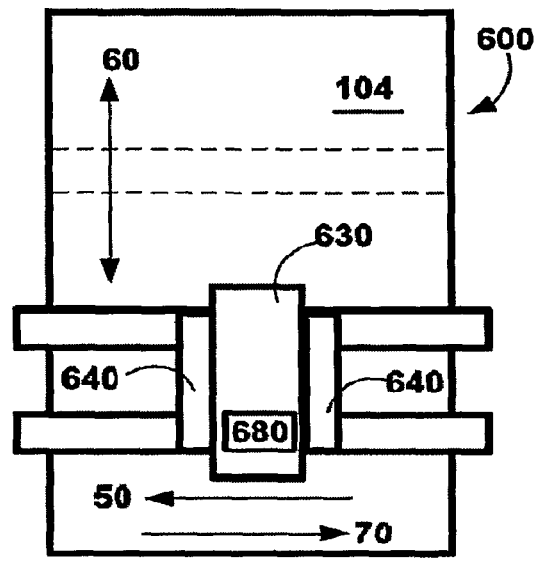
FIG. 6 is a schematic illustration of exemplary architectures of inkjet printers utilizing the present printing method.
Figure 6B:
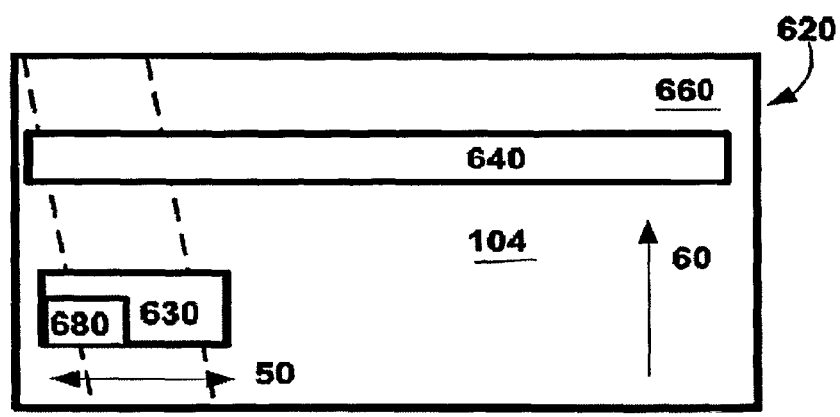

FIG. 6 is a schematic illustration of different printer architectures, presented and described for better understanding of the invention. FIG. 6A shows a plan view of a flat bed printer 600 where both the print head 630 and the media 104 may move in a reciprocal type of movement with respect to each other. Here, the print head 630 may be moved in a longitudinal direction (indicated by arrows 50 and 70), whereas the media 104 may be moved in a lateral direction (indicated by arrow 60). Printing is performed by depositing ink droplets as the position of the print head is moved relative to the media such that a generally rectangular swath parallel to one of the movement directions is printed (i.e. the rectangular swath will be elongated longitudinally or laterally).

FIG. 6B shows a plan view of a drum type printer 620 where media 104 is wrapped around drum 660 rotating in the direction indicated by arrow 60. While the drum 600 rotates, the print head 630 deposits ink droplets as it moves in the direction of arrow 50, thereby printing an inclined or helical swath.

Printers 600 and 620 included an ink droplet location unit 680, which processes data to be printed such that individual ink droplets deposited on the substrate are located in a sparse arrangement according to the invention. The ink droplet location unit 680 may be implemented as a software or hardware and may be associated with the print head electronics. Alternatively, it may be part of the Raster Image Processor (RIP).

When a drum printer 620 prints in a helical print mode, the ink layer printed at the last pass may be exposed to a lower amount of UV curing radiation than ink layers printed by the earlier passes. Thus, in a further embodiment, upon completion of printing of the image, the UV lamp 640 is not switched off and the drum 660 holding the media 104 makes an additional rotation to ensure full curing of the printed image. Such an additional curing rotation may be undertaken during a rotation of the drum 660 that is used for unloading the media 104, thereby increasing the exposure time to UV curing radiation (and therefore the supplied energy) without increasing the overall UV system power.

In another embodiment, the rotation speed of the drum 660 may be decreased during the last pass in order to increase the amount of time that the ink printed in the last pass is exposed to curing radiation.

The same may be true for flat bed printing machines where the print head or the bed supporting the substrate move in helical or step like manner. It is desirable for the printed ink droplets to be fully cured upon completion of printing, and therefore at least one additional pass may be made over the final printed ink with only UV lamp operating.

An embodiment of the invention provides a method of printing an image on a substrate using a curable ink, wherein the method comprises the steps of: irrespective of the image to be printed, generating a pattern of spaced apart ink droplet locations for representing the image; separating the pattern into at least first and second different interleaved portions, each portion comprising a plurality of droplet locations and the droplet locations of each interleaved portion being spaced apart from each other; in a first printing pass, depositing ink droplets on the substrate at the drop locations of the first interleaved portion; in a final printing pass, depositing ink droplets on the substrate at the droplet locations of the second interleaved portion; and curing said deposited ink droplets by exposing the deposited ink droplets to curing radiation in a first partial curing step between the first and final printing passes and in a final Curing step.

While specific embodiments have been described herein for purposes of illustration, various modifications will be apparent to a person skilled in the art and may be made without departing from the scope of the invention.

The invention claimed is:

1. A method of printing an image on a substrate using a curable ink, the method comprising:
   generating an image wise pattern of spaced apart ink droplet locations for representing the image;
   separating the pattern into at least first and second different interleaved portions, each portion comprising a plurality of droplet locations and the droplet locations of each interleaved portion being spaced apart from each other;
   in a first printing pass, depositing ink droplets on the substrate at the drop locations of the first interleaved portion;
   in a final printing pass, depositing ink droplets on the substrate at the droplet locations of the second interleaved portion; and
   curing said deposited ink droplets by exposing the deposited ink droplets to curing radiation in a first partial curing step between the first and final printing passes and in a final curing step,
   wherein the first partial curing step is performed only after the first printing pass has been completed,
   wherein no curing is performed in either the first printing pass or the final printing pass,
   and wherein curing of the ink droplets deposited in the final printing pass occurs only during the final curing step.

2. A method of printing according to claim 1, wherein the deposited ink droplets are deposited with a substantially uniform width and each deposited ink droplet is spaced apart from the remaining droplets of ink deposited in the same printing pass by a distance at least equal to the width of a deposited ink droplet.

3. A method according to claim 1, wherein the curable ink is ultra-violet, UV, curable ink that is curable by exposure to UV radiation.

4. A method according to claim 1, wherein said deposited ink droplets form a single ink layer on the substrate.

5. A method according to claim 1, wherein the final curing step comprises, after the final printing pass, moving the substrate past a source of curing radiation such that said deposited ink droplets are exposed to curing radiation one or more times to ensure full curing of the deposited ink droplets.

6. A non-transitory computer-readable data storage medium having a computer program stored thereon, wherein execution of the computer program by a computing device causes a method to be performed, the method comprising:
- generating an image wise pattern of spaced apart ink droplet locations for representing the image;
- separating the pattern into at least first and second different interleaved portions, each portion comprising a plurality of droplet locations and the droplet locations of each interleaved portion being spaced apart from each other;
- in a first printing pass, depositing ink droplets on the substrate at the drop locations of the first interleaved portion;
- in a final printing pass, depositing ink droplets on the substrate at the droplet locations of the second interleaved portion; and
- curing said deposited ink droplets by exposing the deposited ink droplets to curing radiation in a first partial curing step between the first and final printing passes and in a final curing step,
- wherein the first partial curing step is performed only after the first printing pass has been completed,
- wherein no curing is performed in either the first printing pass or the final printing pass,
- and wherein curing of the ink droplets deposited in the final printing pass occurs only during the final curing step.

7. Apparatus for printing an image on a substrate using a curable ink, the apparatus comprising:
- an ink droplet location unit adapted to generate a pattern of spaced apart ink droplet locations for representing the image and to separate the pattern into at least first and second different interleaved portions, each portion comprising a plurality of droplet locations and the droplet locations of each interleaved portion being spaced apart from each other;
- a print head arranged to deposit ink droplets on the substrate at the drop locations of the first interleaved portion;
- a print head arranged to deposit ink droplets on the substrate at the drop locations of the second interleaved portion; and
- curing means for curing said deposited ink droplets by exposing the deposited ink droplets to curing radiation in a first partial curing step between first and final printing passes and in a final curing step,
- wherein the first partial curing step is performed only after the first printing pass has been completed,
- wherein no curing is performed in either the first printing pass or the final printing pass,
- and wherein curing of the ink droplets deposited in the final printing pass occurs only during the final curing step.

8. Apparatus according to claim 7, wherein the deposited ink droplets are deposited with a substantially uniform width and each deposited ink droplet is spaced apart from the remaining droplets of ink deposited at locations of the same interleaved portion by a distance at least equal to the width of a deposited ink droplet.

9. Apparatus according to claim 7, wherein the curable ink is ultra-violet, UV, curable ink that is curable by exposure to UV radiation and the curing means are adapted to emit UV radiation.

10. Apparatus according to claim 7, wherein the apparatus is arranged to deposit the ink droplets such that they form a single droplet ink layer on the substrate.

11. Apparatus according to claim 7, wherein the apparatus is adapted to move the substrate past the curing means in the final curing step such that said deposited ink droplets are exposed to curing radiation one or more times to ensure full curing of the deposited ink droplets.

12. Apparatus according to claim 7, wherein the apparatus is a printer.

* * * * *